United States Patent
Kim et al.

(10) Patent No.: US 10,249,776 B2
(45) Date of Patent: Apr. 2, 2019

(54) HETEROJUNCTION SOLAR CELL AND MANUFACTURING METHOD THEREOF

(71) Applicant: LG ELECTRONICS INC., Seoul (KR)

(72) Inventors: Hwanyeon Kim, Seoul (KR); Jeongkyu Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/857,255

(22) Filed: Dec. 28, 2017

(65) Prior Publication Data

US 2018/0212083 A1    Jul. 26, 2018

(30) Foreign Application Priority Data

Jan. 20, 2017  (KR) .................. 10-2017-0009517

(51) Int. Cl.
*H01L 31/0224* (2006.01)
*H01L 31/074* (2012.01)
*H01L 31/18* (2006.01)

(52) U.S. Cl.
CPC ......... *H01L 31/022491* (2013.01); *H01L 31/022425* (2013.01); *H01L 31/074* (2013.01); *H01L 31/1884* (2013.01); *Y02E 10/50* (2013.01)

(58) Field of Classification Search
CPC ......... H01L 31/022425; H01L 31/0376; H01L 31/03767; H01L 31/0747; H01L 31/1884; H01L 31/202; H01L 31/204; H01L 31/208; H01L 31/022491

USPC ............................................... 438/57; 257/40
See application file for complete search history.

(56) References Cited

U.S. PATENT DOCUMENTS

| 9,761,344 B2* | 9/2017 | Yoon ...................... H01B 1/08 |
| 2007/0169812 A1* | 7/2007 | Robinson ............ C23C 18/1204 136/262 |
| 2012/0142140 A1 | 6/2012 | Li et al. |
| 2013/0228902 A1* | 9/2013 | Tomizawa ........ H01L 29/66757 257/655 |
| 2015/0053263 A1* | 2/2015 | Imamura ............ H01L 21/02532 136/256 |
| 2017/0033257 A1* | 2/2017 | Kim ................. H01L 31/022466 |
| 2017/0179333 A1* | 6/2017 | Lee ..................... H01L 31/1884 |

FOREIGN PATENT DOCUMENTS

| EP | 3096360 A1 | 11/2016 |
| EP | 3125303 A1 | 2/2017 |
| JP | 2006-128098 A | 5/2006 |
| JP | 2013-234106 A | 11/2013 |
| JP | 2014-515160 A | 6/2014 |

(Continued)

*Primary Examiner* — Mohammed Shamsuzzaman
(74) *Attorney, Agent, or Firm* — Birch, Stewart, Kolasch & Birch, LLP

(57) ABSTRACT

Discussed is a method of manufacturing a heterojunction solar cell, including: forming a metal compound on a semiconductor substrate; forming a transparent conductive oxide on the metal compound; forming an electrode forming material on the transparent conductive oxide; and sintering the electrode forming material using light sintering to form an electrode part. The transparent conductive oxide may be sintered by light sintering to form a transparent conductive oxide layer formed of the transparent conductive oxide.

8 Claims, 4 Drawing Sheets

(56) References Cited

FOREIGN PATENT DOCUMENTS

| JP | 2014-518589 A | 7/2014 |
|----|---------------|--------|
| JP | 2015-159266 A | 9/2015 |
| JP | 2016-508164 A | 3/2016 |
| JP | 2016-174154 A | 9/2016 |
| WO | WO 2014/134515 A1 | 9/2014 |

* cited by examiner

HETEROJUNCTION SOLAR CELL AND MANUFACTURING METHOD THEREOF

CROSS-REFERENCE TO RELATED APPLICATION

This application claims priority to and the benefit of Korean Patent Application No. 10-2017-0009517 filed in the Korean Intellectual Property Office on Jan. 20, 2017, the entire contents of which are incorporated herein by reference.

BACKGROUND OF THE INVENTION

Field of the Invention

Embodiments of the invention relate to a heterojunction solar cell and fabricating method thereof, and more particularly to a heterojunction solar cell using a layer formed of a metal compound and a manufacturing method thereof.

Background of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

Such solar cells have various layers and electrodes, and the solar cell efficiency is determined by how the various layers and electrodes are designed. Therefore, in order to commercialize the solar cell, it is required to maximize the efficiency of the solar cell and minimize the manufacturing cost.

On the other hand, in order to form an electrode pattern of a silicon solar cell, a conductive silver (Ag) paste is mainly used as an electrode material.

The sintering method for improving the conductivity of the electrode material includes a high-temperature sintering method using a furnace, a laser sintering method for sintering a small area with strong light, a microwave sintering method using a microwave in a chamber, and a plasma sintering method in which powder material is sintered by applying pressure, low voltage and convection. Meanwhile, most companies manufacturing commercial solar cells use thermal sintering processes.

SUMMARY OF THE INVENTION

An object of the invention is to provide a high-efficiency heterojunction solar cell and manufacturing method thereof.

According to an aspect of the present invention, there is provided a method of manufacturing a heterojunction solar cell, including: forming a metal compound on a semiconductor substrate; forming a transparent conductive oxide on the metal compound; forming an electrode forming material on the transparent conductive oxide; and sintering the electrode forming material using light sintering to form an electrode part. The transparent conductive oxide may be sintered by light sintering to form a transparent conductive oxide layer formed of the transparent conductive oxide.

According to an embodiment of the present invention, when light sintering the electrode forming material, the transparent conductive oxide can be light sintered together. Therefore, the transparent conductive oxide layer and the electrode part can be formed at the same time.

According to another embodiment of the present invention, when the transparent conductive oxide and the electrode forming material are light sintered together, the metal compound can be light sintered together. Therefore, the metal compound layer, the transparent conductive oxide layer, and the electrode part can be formed at the same time.

At this time, the light sintering can be performed using a xenon flash lamp having an energy (E) of 5 $J/cm^2$ to 500 $J/cm^2$, a pulse width (W) of 0.1 ms to 50 ms, a pulse number (N) of 1 to 100 times, and a pulse gap of 1 ms to 100 ms.

According to another embodiment of the present invention, the metal compound layer and the transparent conductive oxide layer may be formed first by light sintering the metal compound and the transparent conductive oxide. Then, the electrode part can be formed by coating, drying and light sintering the electrode forming material.

At this time, the light sintering of the electrode forming material can be performed using a xenon flash lamp having an energy (E) of 5 $J/cm^2$ to 500 $J/cm^2$, a pulse width (W) of 0.1 ms to 50 ms, a pulse number (N) of 1 to 100 times, and a pulse gap of 1 ms to 100 ms.

The light sintering of the metal compound and the transparent conductive oxide can be performed using a xenon flash lamp used for light sintering the electrode forming material. In this instance, light sintering of the metal compound and the transparent conductive oxide can be performed using a xenon flash lamp with energy and pulse number lower than the energy and the pulse number of the xenon flash lamp used for light sintering the electrode forming material.

The metal compound may be formed of any one of metal oxides selected from oxides including metals (particularly transition metals), preferably molybdenum oxide, titanium oxide, vanadium oxide, tungsten oxide, zinc oxide, manganese oxide, nickel oxide, and chromium oxide.

The transparent conductive oxide may be formed of any one material selected from ITO, IWO, IZO, and AZO.

The electrode forming material may be formed of a conductive paste containing metal particles, a binder and a solvent, and the metal particles may include at least one selected from copper, copper-silver, and copper-nickel.

The fine metal particles can be formed into micro- or nano-sized particles. The conductive paste may be formed by mixing 50 to 80% by weight, 15 to 40% by weight, and 5 to 40% by weight of the metal particles, the binder, and the solvent, respectively, with respect to a total weight of the conductive paste.

The manufacturing method of the present invention may further include forming a tunnel layer on the semiconductor substrate before forming of the metal compound on the semiconductor substrate, and the tunnel layer may be formed of intrinsic amorphous silicon or silicon oxide.

The heterojunction solar cell produced by such a manufacturing method includes a semiconductor substrate; a first metal compound layer positioned on a first surface of the semiconductor substrate and having a first conductivity type; a second metal compound layer positioned on a second surface opposite the first surface of the semiconductor substrate or positioned on the first surface in a state spaced apart from the first metal compound layer, the second metal compound having a second conductivity type opposite to the first conductivity type; a first electrode part electrically connected to the first metal compound layer; a second electrode part electrically connected to the second metal compound layer; and a transparent conductive oxide layer positioned between the first metal compound layer and the first electrode part, and between the second metal compound layer and the second electrode part.

The first metal compound layer and the second metal compound layer are formed of a binary metal oxide containing at least one metal (particularly transition metal) selected from molybdenum, titanium, vanadium, tungsten, zinc, manganese, nickel and chromium.

The first electrode part and the second electrode part include at least one metal particle selected from copper, copper-silver, and copper-nickel, and the at least one metal particle may have a size of 200 nm or less.

The transparent conductive oxide layer may be formed of any one material selected from ITO, IWO, IZO, and AZO.

In this instance, the transparent conductive oxide layer positioned between the first metal compound layer and the first electrode part may be formed of the same material as that of the transparent conductive oxide layer positioned between the second metal compound layer and the second electrode part. Or may be formed of different materials.

In the latter instance, the transparent conductive oxide layer positioned between the first metal compound layer and the first electrode part or the transparent conductive oxide layer positioned between the second metal compound layer and the second electrode part is formed of IWO, and the other transparent conductive oxide layer may be formed of any one material selected from ITO, IZO, and AZO.

According to the method of manufacturing a heterojunction solar cell according to an embodiment of the present invention, the transparent conductive oxide layer and/or the metal compound layer can be light-sintered with a light sintering apparatus used for light sintering the electrode forming material. Thus, the apparatus cost and the processing time can be reduced.

For example, when the metal compound and the transparent conductive oxide are annealed (or sintered) in a furnace, a time of about 20 minutes is required. However, in the instance of light sintering, a time of about one minute is required.

Therefore, the manufacturing cost of the heterojunction solar cell can be reduced due to the reduction of the device cost and the process time.

Further, since the metal compound and the transparent conductive oxide can be light-sintered simultaneously during light sintering of the electrode forming material, deterioration of the film properties of the metal compound layer and the transparent conductive oxide layer can be prevented or reduced.

Also, in the instance of light sintering the electrode forming material after light sintering the metal compound and the transparent conductive oxide, the deterioration of the film characteristics due to the thermal process can be minimized.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Figure 1:
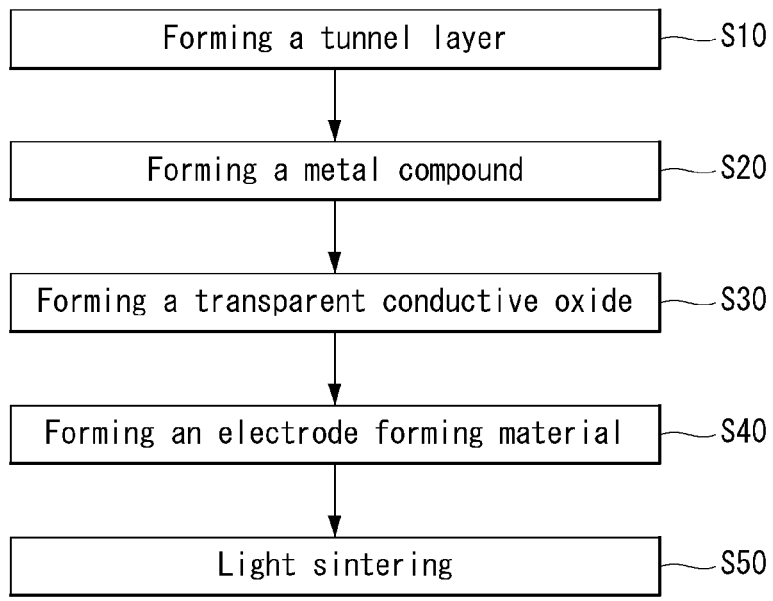
FIG. 1 is a block diagram showing a method of manufacturing a heterojunction solar cell according to a first embodiment of the present invention.

Reference will now be made in detail to embodiments of the invention examples of which are illustrated in the accompanying drawings. Since the invention may be modified in various ways and may have various forms, specific embodiments are illustrated in the drawings and are described in detail in the specification. However, it should be understood that the invention are not limited to specific disclosed embodiments, but include all modifications, equivalents and substitutes included within the spirit and technical scope of the invention.

The terms 'first', 'second', etc., may be used to describe various components, but the components are not limited by such terms. The terms are used only for the purpose of distinguishing one component from other components.

For example, a first component may be designated as a second component without departing from the scope of the embodiments of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component.

On the other hand, when an arbitrary component is described as "being directly connected to" or "being directly linked to" another component, this should be understood to mean that no other component exists between them.

The terms used in this application are used to describe only specific embodiments or examples, and are not intended to limit the invention. A singular expression can include a plural expression as long as it does not have an apparently different meaning in context.

In this application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the invention pertains.

The terms defined in a generally used dictionary must be understood to have meanings identical to those used in the context of a related art, and are not to be construed to have ideal or excessively formal meanings unless they are obviously specified in this application.

The following example embodiments of the invention are provided to those skilled in the art in order to describe the invention more completely. Accordingly, shapes and sizes of elements shown in the drawings may be exaggerated for clarity.

Hereinafter, a heterojunction solar cell according to an embodiment of the present invention and a method of manufacturing the same will be described with reference to the accompanying drawings.

FIG. 1 is a block diagram showing a method of manufacturing a heterojunction solar cell according to a first embodiment of the present invention.

Referring to FIG. 1, a method of manufacturing a heterojunction solar cell according to the first embodiment includes a step S20 of forming (for example, laminating or coating) a metal compound, for example, a metal oxide, on the surface of a semiconductor substrate, a step S30 of forming a transparent conductive oxide on the metal oxide, a step S40 of forming an electrode forming material on the surface of the transparent conductive oxide, and a step S50 of performing light sintering by a light sintering method.

In the step S50 of performing the light sintering, the electrode part and the transparent conductive oxide layer positioned under the electrode part can be simultaneously light sintered. Further, in the step S50 of performing the light sintering, the electrode part, the transparent conductive oxide layer positioned under the electrode part, and the metal oxide layer positioned under the transparent conductive oxide layer can be simultaneously light sintered.

Hereinafter, as an example, light sintering of the electrode part, the transparent conductive oxide layer, and the metal compound layer simultaneously in the step S50 of performing the light sintering will be described.

The method of manufacturing a heterojunction solar cell according to the first embodiment may further include a step S10 of forming the tunnel layer on the semiconductor substrate before the metal compound is stacked on the semiconductor substrate.

Hereinafter, the instance where the heterojunction solar cell comprises the tunnel layer is described as an example, but the tunnel layer may not be provided in the heterojunction solar cell.

The semiconductor substrate may be formed of any one material selected from among amorphous silicon, mono-crystalline silicon, and poly-crystalline silicon. Preferably, but not necessarily, the semiconductor substrate may be formed of crystalline silicon.

The semiconductor substrate may be formed of a base region doped with a low doping concentration of the first conductivity type dopant or the second conductivity type dopant.

That is, in the homogeneous junction solar cell, the semiconductor substrate includes the base region, the emitter region having the conductivity type opposite to that of the base region, and the back surface field region having the same conductivity type as the base region and the doping concentration higher than that of the base region. However, in the present invention, the semiconductor substrate is composed of only the base region and does not have a separate dopant doping region such as an emitter region and a back surface field region.

The dopant in the base region may be an n-type or a p-type dopant. That is, when the dopant in the base region is n-type, a Group V element such as phosphorus (P), arsenic (As), bismuth (Bi), and antimony (Sb) can be used as a dopant. When the dopant in the base region is p-type, a group III element such as boron (B), aluminum (Al), gallium (Ga), or indium (In) may be used as a dopant.

As described above, the semiconductor substrate provided in the heterojunction solar cell of this embodiment has only the base region and does not have a separate doping region formed by doping and/or diffusing the dopant.

In one example, the difference between the highest doping concentration and the lowest doping concentration in the semiconductor substrate may be 10% or less.

At this time, "10% or less" is only an example to specify that dopant injection and/or diffusion for forming a doped region is not performed, but the embodiments of the present invention are not limited thereto.

Therefore, the present invention includes all instances in which a separate doped region formed by implanting and/or diffusing a dopant into the semiconductor substrate is not provided.

If a separate doped region doped with a dopant is not formed in the semiconductor substrate, the open-circuit voltage can be improved. This is because it is possible to prevent surface recombination that may occur by forming a separate doped region in the semiconductor substrate.

Before forming the tunnel layer on the semiconductor substrate, at least one surface of the semiconductor substrate may be formed as a textured surface.

The textured surface refers to a surface having a plurality of irregularities, and prevents reflection of light incident on the semiconductor substrate.

In the instance of a solar cell having a double-side light-receiving structure, a textured surface may be formed on the front and back surfaces of the semiconductor substrate, respectively. In the instance of a solar cell having a single-sided light-receiving structure, the textured surface can be formed only on the front surface of the semiconductor substrate.

After the textured surface is formed on at least one surface of the semiconductor substrate, the tunnel layer is formed on at least one surface of the semiconductor substrate (S10). When the tunnel layer is not provided, this step may be omitted.

The tunnel layer may be formed by depositing a dielectric material or a semiconductor material.

The tunnel layer acts as a barrier to electrons and holes. Accordingly, the tunnel layer blocks the minority carriers from passing through the tunnel layer, and passes a majority carrier having a desired energy or more after being accumulated at a portion adjacent to the tunnel layer.

At this time, the majority carriers having the desired energy or more can easily pass through the tunnel layer by the tunneling effect.

If the thickness of the tunnel layer exceeds 10 nm, the tunneling may not effectively occur and the solar cell may not operate effectively. Therefore, the thickness of the tunnel layer may be 10 nm or less, preferably 5 nm or less, more preferably 2 nm or less.

If the thickness of the tunnel layer is less than 0.5 nm, it may be difficult to form the tunnel layer of desired quality. Therefore, the tunnel layer may be formed to have a thickness of 0.5 nm to 2 nm.

However, the embodiments of the present invention are not limited thereto, and the thickness of the tunnel layer may have various values.

The tunnel layer may also function as a passivation layer and may be formed of a dielectric material such as silicon oxide (SiOx) or a semiconductor material such as intrinsic amorphous silicon (i-a-Si) or silicon carbide (SiC).

However, the tunnel layer may also be formed of silicon nitride (SiNx), hydrogenated silicon nitride (SiNx:H), aluminum oxide (AlOx), silicon oxynitride (SiON) or hydrogenated silicon oxynitride (SiON:H).

When the tunnel layer is formed of the intrinsic amorphous silicon layer (i-a-Si), the surface characteristics of the semiconductor substrate can be improved more effectively because the tunnel layer has properties similar to those of the semiconductor substrate. Therefore, the passivation characteristic can be greatly improved.

In a solar cell having a structure in which the metal compound layer (or a metal oxide layer) acting as an emitter region and an electric field region (for example, a back surface field region) is separately formed on the front surface and the back surface of the semiconductor substrate, the tunnel layer may be formed entirely on the front surface and the back surface of the semiconductor substrate.

Thus, the tunnel layer has excellent passivation characteristics and can be easily formed without additional patterning. The tunnel layer may be an un-doped film containing no dopant.

Alternatively, in a solar cell having a back contact structure in which the metal compound layer (or metal oxide layer) serving as an emitter region and the metal compound layer serving as a surface field region are respectively positioned on the back surface of the semiconductor substrate, the tunnel layer may be formed only on the back surface of the semiconductor substrate. When a solar cell having a back contact structure has a front surface field (FSF) region on the front surface of the semiconductor substrate, the tunnel layer may be formed on the front surface of the semiconductor substrate or may not be formed.

After the tunnel layer is formed, the metal compound is entirely deposited on the surface of the tunnel layer (S20).

The metal compound is a compound containing a metal, which is a compound in which a metal is combined with a non-metal such as carbon, oxygen, boron, silicon, etc. In the following description, it is assumed that the metal compound is a metal oxide.

The metal oxide refers to an oxide containing a metal and is annealed by a light sintering process to form a metal oxide layer.

The metal may be a transition metal (for example, molybdenum, titanium, vanadium, tungsten, zinc, manganese, nickel, and/or chromium).

Therefore, the metal oxide containing the transition metal can be said to be a binary metal oxide.

The metal oxide layer selectively collects first or second carriers (electrons or holes) having different polarities due to energy band difference from the semiconductor substrate. Also, the metal oxide layer has the first conductivity type or the second conductivity type due to the inherent Fermi level of the contained transition element. Therefore, the metal oxide layer formed of a metal oxide can function as the emitter region or the surface field region without including a dopant for imparting a conductivity type.

The binary metal oxide constituting the metal oxide layer capable of selectively extracting and collecting holes has a Fermi level lower than the Fermi level of the semiconductor substrate. Also, the binary metal oxide has a work function greater than the work function of the semiconductor substrate.

For example, when the work function of the semiconductor substrate is about 3.7 eV, the work function of the metal oxide layer that selectively extracts and collects holes may be 3.8 eV to 7 eV.

Here, the work function of the metal oxide layer for selectively extracting and collecting holes is limited to 3.8 eV to 7 eV because if the work function of the metal oxide layer exceeds 7 eV, it is difficult to selectively collect holes, and if the work function is less than 3.8 eV, it is difficult to selectively collect holes only.

When the metal oxide layer having the Fermi level and the work function is bonded to the semiconductor substrate with the tunneling layer interposed therebetween, the holes in the semiconductor substrate can easily pass through the tunnel layer to the metal oxide layer. On the other hand, electrons in the semiconductor substrate do not pass through the tunnel layer.

Examples of the binary metal oxide for forming a metal oxide layer capable of selectively extracting and collecting holes include molybdenum oxide, tungsten oxide (for example, $WO_3$), vanadium oxide, nickel oxide, and rhenium oxide. Particularly, when the metal oxide layer is made of molybdenum oxide or tungsten oxide, the effect of selectively collecting holes is excellent.

The metal oxide layer capable of selectively collecting electrons may have a Fermi level higher than the Fermi level of the semiconductor substrate and a work function smaller than the work function of the semiconductor substrate.

For example, when the work function of the semiconductor substrate is about 3.7 eV, the work function of the metal oxide layer capable of selectively collecting electrons may be 0.1 eV to 3.6 eV.

More specifically, the energy band gap between the conduction band of the metal oxide layer capable of selectively collecting electrons and the conduction band of the semiconductor substrate may be 1 eV or less (for example, 0.1 eV to 1 eV).

If the energy band gap is more than 1 eV or less than 0.1 eV, it may be difficult to selectively collect electrons.

When the metal oxide layer having the Fermi level and the work function is bonded to the semiconductor substrate with the tunneling layer interposed therebetween, the electrons in the semiconductor substrate can easily pass through the tunnel layer to the metal oxide layer. On the other hand, holes in the semiconductor substrate do not pass through the tunnel layer.

Examples of the binary metal oxide that forms the metal oxide layer capable of selectively extracting and collecting electrons include titanium oxide (for example, $TiO_2$), zinc oxide (for example, ZnO), niobium oxide, and the like. Particularly, when the metal oxide layer is made of titanium oxide, the effect of selectively collecting electrons is excellent.

As described above, the metal oxide layer capable of selectively extracting and collecting holes and the metal oxide layer capable of selectively extracting and collecting electrons are formed of different materials.

The metal oxide layer having a binary metal oxide is a material which can easily extract and collect the first or second carrier (electrons or holes) and can prevent recombination due to the dopant. Therefore, the open-circuit voltage can be improved.

And the loss due to light absorption can be reduced as compared with the doped region or the doped film, and the short circuit current density can be improved. Thus, the efficiency of the solar cell can be improved.

Further, a step of doping a separate dopant for imparting conductivity, a step of activating the dopant, and the like can be omitted. In particular, since a low-temperature process can be performed instead of the high-temperature process, the manufacturing process can be simplified and the manufacturing cost can be reduced. Therefore, the productivity of the solar cell can be improved.

When the binary metal oxide layer has a crystalline structure, the passivation property is largely lowered and the efficiency of the solar cell is significantly lowered. Therefore, it is preferable that the metal oxide layer composed of the binary metal oxide has an amorphous structure.

The reason why the passivation property is largely lowered when the binary metal oxide layer has a crystalline structure has not been disclosed. However, this feature can be confirmed experimentally. Although it is unclear, it is expected that if the crystal structure is abundant, the light absorption causing current loss increases greatly, and the surface roughness of the metal oxide layer acting as interface defect increases, resulting in a large recombination loss.

When the metal oxide layer has an amorphous structure, it is preferable that the boundary portion of the metal oxide layer adjacent to the tunnel layer is formed of an amorphous portion in which the amorphous portion is formed wider than the crystalline portion.

Particularly, when the amorphous portion positioned at the boundary of the metal oxide layer adjacent to the tunnel layer has an amorphous structure as a whole, it can have an excellent passivation property.

For example, when the ratio of the area occupied by the amorphous portion in the boundary portion of the metal oxide layer adjacent to the tunnel layer is 95% to 100%, the passivation effect is improved and the efficiency of the solar cell is increased.

At this time, the ratio of the thickness of the amorphous portion to the total thickness of the metal oxide layer may be 0.2 or more (that is, 0.2 to 1), or the thickness of the amorphous portion in the metal oxide layer may be 1 nm or more.

As described above, when the amorphous portion having a certain thickness or more (for example, a thickness ratio of 0.2 or more or a thickness of 1 nm or more) is disposed at the boundary portion adjacent to the tunnel layer, passivation characteristics can be sufficiently realized.

In the metal oxide layer, the non-amorphous portion may be a crystalline portion, and the crystalline portion may improve carrier mobility, thereby improving the efficiency of carrier transport.

Therefore, in order to crystallize the metal oxide, that is, to secure the electric conductivity of the metal oxide layer by securing the crystalline portion of the metal oxide layer to a certain level, it is preferable to carry out an activation process. The annealing process for activating the metal oxide layer may be performed by the light sintering method.

When light is irradiated on the metal oxide layer, heat is generated in the metal oxide layer, and the crystallization of the metal oxide proceeds due to the generated heat.

The metal oxide may be deposited by a deposition apparatus, and the thickness of the metal oxide layer may be 2 nm to 30 nm, preferably 2 nm to 10 nm.

After the metal oxide is laminated, the transparent conductive oxide is laminated on the surface of the metal oxide (S30).

The transparent conductive oxide may be at least one of indium tin oxide (ITO), indium zinc oxide (IZO), aluminum-doped zinc oxide (AZO), indium tungsten oxide (IWO), and may be formed on the metal oxide by various film forming methods (for example, physical vapor deposition or chemical vapor deposition).

The transparent conductive oxide layer formed of the transparent conductive oxide can act as a transparent electrode layer and/or an anti-reflection film, and can reduce the contact resistance with the metal oxide layer. Also, by preventing the electrode part including the metal such as copper (Cu) from directly contacting the metal oxide layer, it is possible to prevent the recombination of the carriers from being increased. It is also possible to prevent diffusion of metal ions contained in the electrode part into the metal oxide layer.

At this time, the metal oxide layer and the transparent conductive oxide layer are formed of different materials, and the electrical conductivity of the transparent conductive oxide layer may be higher than the electrical conductivity of the metal oxide layer.

The transparent conductive oxide layer includes both an amorphous portion and a crystalline portion, similar to the metal oxide layer. Therefore, an annealing process is required to secure the electric conductivity of the transparent conductive oxide layer to a certain level. Annealing of the transparent conductive oxide layer can also be performed by the light sintering method.

After the transparent conductive oxide is laminated, the electrode forming material is laminated on the surface of the transparent conductive oxide (S40).

The electrode forming material may be formed of a conductive paste containing fine metal particles, a binder and a solvent, and the fine metal particles may be at least one selected from copper, copper-silver, and copper-nickel.

The fine metal particles can be formed in a nanoscale size, for example, 10 nm to 200 nm. The plurality of fine metal particles contained in the conductive paste may include a plurality of first fine metal particles having a first average size (or average particle diameter) and a plurality of second fine metal particles having a second average size (or average particle diameter), and the second average size of the second fine metal particles may be greater than the first average size of the fine metal particles.

The conductive paste may be formed by mixing 50 to 80% by weight, 15 to 40% by weight, and 5 to 40% by weight of the fine metal particles, the binder, and the solvent, respectively, with respect to the total weight of the conductive paste.

Examples of the solvent used for dispersing the fine metal particles include ethylene glycol, diethylene glycol, triethylene glycol, poly-ethylene glycol, propylene glycol propylene glycol, dipropylene glycol, hexylene glycol, glycerine, iso-propyl alcohol, 2-methoxy ethanol, pentyl alcohol, hexyl alcohol, butyl alcohol, octyl alcohol, form amide, methyl ethyl ketone, ethyl alcohol, methyl alcohol, acetone, or a mixture of two or more selected from the above-mentioned solvents.

In addition, a binder may be added in order to improve the dispersion characteristics and reduction characteristics of the conductive paste. Preferably, but not necessarily, polyvinylpyrrolidone (PVP), polyvinyl alcohol (PVA), polyvinyl butyral, polyethylene glycol, polymethyl methacrylate, dextran, azobis, sodium dodecylbenzenesulfate and the like can be used as the binder.

The conductive paste may be formed on the substrate by one or more methods selected from the group consisting of screen printing, inkjet printing, micro-contact printing, imprinting, gravure printing, gravure-offset printing, flexography printing, and spin coating. Other methods are also usable.

The printed conductive paste is subjected to a drying process. As the drying process, hot air, a heat chamber, a hot plate, an infrared ray, or a combination thereof may be used. The drying temperature is preferably maintained at 60 to 200° C. so as not to damage the silicon substrate.

After the electrode forming material is laminated, the electrode forming material is light sintered using a light sintering apparatus (S50).

When the electrode forming material is light sintered, annealing is performed to activate the transparent conductive oxide layer formed of the transparent conductive oxide.

Annealing is also performed to activate the metal oxide layer formed of the metal oxide.

Therefore, when the light sintering step (S50) is performed, the metal oxide layer, the transparent conductive oxide layer, and the electrode part can be simultaneously formed.

Hereinafter, the light sintering method using the light sintering apparatus will be described with reference to FIGS. 1 and 3 to 4.

The light sintering apparatus may include a light output section 10, a power source section, a power storage section, and a transfer section 20.

The light output section 10 may include a lamp 11, a reflector 13, an optical wavelength filter 15, a light guide section 17, and a cooling section 19.

The light output unit 10 is disposed on the upper portion of the transfer unit 20 and receives voltage and current from the power supply unit. The light output unit receives the charge accumulated from the power storage unit to generate an arc plasma, and outputs pulsed white light to the surface of the semiconductor substrate 110. Thus, the metal oxide, the transparent conductive oxide and the electrode forming material are sintered.

The lamp 11 is a Xenon flash lamp, and irradiates the pulsed white light in the form of a plane.

The xenon flash lamp includes a cylinder-shaped sealed quartz tube and a xenon gas injected into the quartz tube. The xenon gas outputs light energy by the input electrical energy, and has an energy conversion rate of more than 50%.

The xenon flash lamp further includes metal electrodes (for example, tungsten electrodes) provided on both sides of the quartz tube to form the positive electrode and the negative electrode. Therefore, when a high power source and a current generated from the power source unit are applied to the lamp 11, the injected xenon gas is ionized and a spark is generated between the positive electrode and the negative electrode.

At this time, when charge accumulated in the power storage unit is applied, a current of about 1000 A flows for 1 ms to 10 ms, and an arc plasma is generated in the lamp 11, and light of strong intensity is generated.

The light is seen as white light because it contains a light spectrum of a wide wavelength band from ultraviolet rays ranging from 160 nm to 2.5 mm to infrared rays.

In the present embodiment, the use of a xenon flash lamp has been described as an example, but any type of lamp may be used as long as it can achieve such a purpose.

Figure 4:
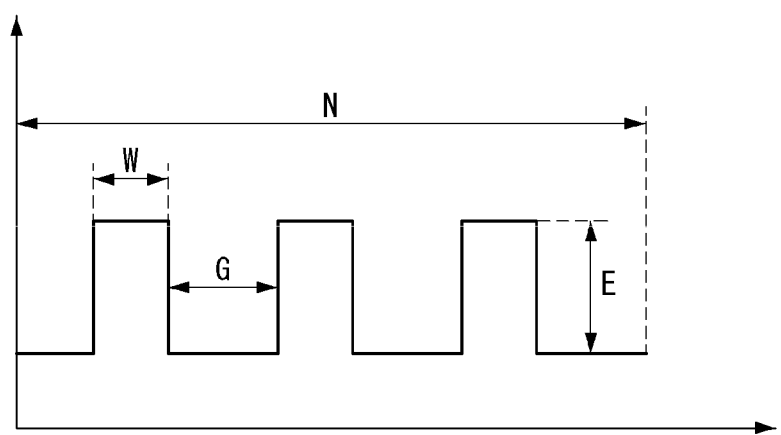
FIG. 4 is a graph showing parameters used in an irradiation condition of pulsed white light generated in a lamp.

At this time, as shown in FIG. 4, the irradiation conditions using the lamp 11 can be adjusted by parameters such as energy (Total Energy, E), a pulse width (W), a pulse number (N), a pulse gap (G).

In order to light sinter the electrode forming material, energy required to melt the binder contained in the electrode forming material and to melt nano-sized metal particles is required.

In this embodiment, the energy E of the lamp 11 is about 5 $J/cm^2$ to 500 $J/cm^2$.

When the energy E of the lamp 11 is less than 5 $J/cm^2$, light sintering of the electrode forming material and annealing (or sintering) of the metal oxide and the transparent conductive oxide may not be effective. When the energy (E) exceeds 500 $J/cm^2$, there is a possibility that the light sintering apparatus is overloaded.

The pulse width W of the lamp 11 is preferably 0.1 ms to 50 ms, more preferably 0.1 ms to 20 ms, in consideration of the efficiency of the light sintering step.

The number of pulses N of the lamp 11 is preferably 1 to 100 times, more preferably 1 to 50 times, in consideration of the efficiency of the light sintering step.

When the number of pulses N of the lamp 11 is three times or more, the pulse gap of the xenon flash lamp is preferably 1 ms to 100 ms in consideration of the effect of the sintering step and the life of the light sintering apparatus, and more preferably from 5 ms to 50 ms.

The reflection plate 13 is disposed on the upper side of the lamp 11 to change the optical path of the pulsed white light output from the lamp 11 in the direction opposite to the semiconductor substrate 110. Thus, pulsed white light emitted from the lamp 11 in the direction opposite to the semiconductor substrate 110 is output toward the semiconductor substrate 110.

The optical wavelength filter 15 is disposed under the lamp 11 to filter only extreme ultraviolet light having a predetermined wavelength band. Therefore, the optical wavelength filter 15 selectively blocks the wavelength band of the light emitted to the semiconductor substrate depending on the type of the semiconductor substrate 110.

The light guiding portion 17 is disposed under the optical wavelength filter 15 and adjusts the position of the pulsed white light so that the pulsed white light can be irradiated onto the semiconductor substrate 110.

The cooling section 19 supplies cooling water to the lamp 11 through a cooling passage to lower the surface temperature of the lamp 11.

The power supply unit generates voltage and current, and can transmit the generated voltage and current to the optical output unit 10.

The power storage unit accumulates and stores the electric charge and transfers the stored electric charge to the lamp 11 when a spark occurs between both electrodes of the lamp 11 of the light output unit 10.

The transfer unit 20 may be a conveyor belt disposed below the optical output unit 10 and transferring the semiconductor substrate 110 in a predetermined direction. At this time, the transfer unit 20 may further include a heating plate for heating the semiconductor substrate 110 or a cooling plate for cooling the semiconductor substrate 110.

When the semiconductor substrate 110 is additionally heated through the heating plate, light sintering can be performed with a small amount of extreme ultraviolet wave energy and the life of the lamp 11 can be prolonged. In addition, when the semiconductor substrate 110 is further cooled through the cooling plate, damage to the semiconductor substrate 110 can be prevented or reduced.

A method of light sintering a metal oxide, the transparent conductive oxide, and the electrode forming material using the light sintering apparatus having such a structure will be described.

The metal oxide, the transparent conductive oxide, and the electrode forming material are sequentially laminated. Then, the metal oxide layer, the transparent conductive oxide layer, and the electrode part are formed by sintering the metal oxide, the transparent conductive oxide and the electrode forming material by irradiating the pulsed white light to the semiconductor substrate.

At this time, the solvent and the binder contained in the electrode forming material are evaporated at a low temperature (for example, 500° C. or less).

Specifically, the solvent contained in the electrode forming material can be evaporated at a temperature of at least 80° C. As an example, the solvent may be evaporated at a temperature of from 80° C. to 150° C.

The binder may be evaporated at a temperature of about 100° C., or higher. As an example, the binder may be evaporated at a temperature of 100° C. to 500° C.

However, the embodiments of the present invention are not limited to this, and the binder may be evaporated at the same temperature as the solvent.

When pulsed white light is irradiated, the electrode forming material is light sintered, and the transparent conductive oxide layer and the metal oxide layer are annealed, respectively.

The irradiation time of the pulsed white light (more precisely, the irradiation time once) may be about 0.1 to 10 ms and may be adjusted depending on the content of the fine metal particles, the binder, and the solvent contained in the electrode forming material.

In one example, the irradiation time (more precisely, once irradiation time) of pulsed white light may be about 0.1 to 2 ms, and may be irradiated for a total of 10 to 30 times, for a total of 1 ms to 40 ms.

Within this range, sintering of the metal oxide, the transparent conductive oxide, and the electrode forming material can be effectively performed.

Furthermore, since the time required for sintering is very short, fine metal particles, such as copper (Cu), which are easily oxidized, can be sintered in a short time, and oxidation of the fine metal particles can be prevented.

In general, copper is known to have an oxide layer formed on its surface due to thermochemical equilibrium, so that sintering is very difficult and the conductivity is reduced even after sintering. In addition, the laser sintering method can only be sintered to a very small area, resulting in poor practicality.

However, the present invention can prevent or reduce the occurrence of oxidation phenomenon of fine metal particles including copper by short-time irradiation of pulsed white light to fine metal particles by using a xenon flash lamp to sinter the fine metal particles.

In the foregoing, an embodiment has been described in which the metal oxide, the transparent conductive oxide, and the electrode forming material are sintered by a single light sintering process.

According to the first embodiment shown in FIG. 1, portions of the metal oxide and the transparent conductive oxide positioned under the electrode forming material may not be completely sintered due to the electrode forming material positioned on the top.

Figure 2:
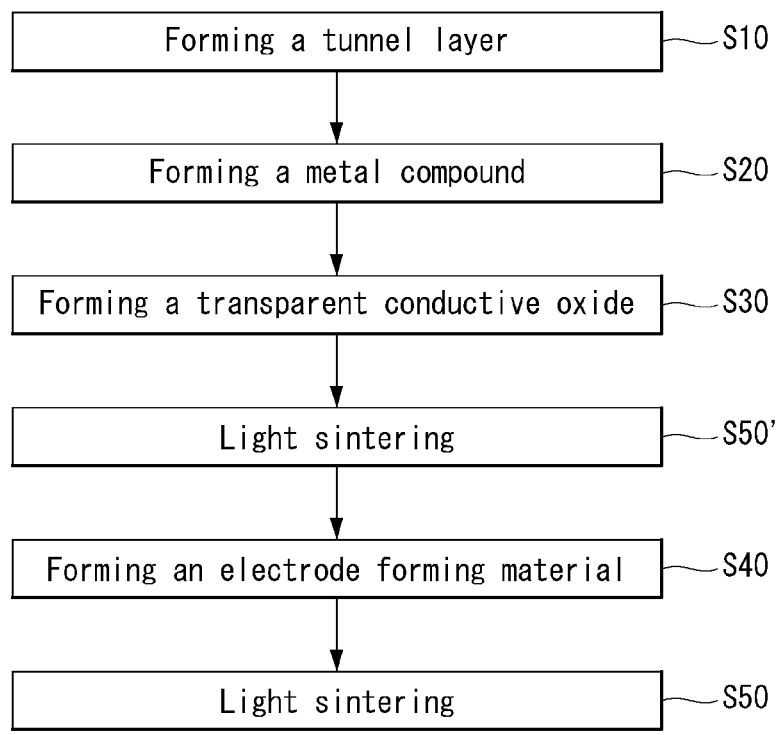
FIG. 2 is a block diagram showing a method of manufacturing a heterojunction solar cell according to a second embodiment of the present invention.

Therefore, in order to completely sinter (or anneal) the metal oxide and the transparent conductive oxide in the portion immediately below the electrode forming material, the manufacturing method according to the second embodiment shown in FIG. 2 can be used.

In the method of manufacturing a heterojunction solar cell according to the second embodiment, a metal oxide and the transparent conductive oxide are laminated, a light sintering process is performed to form a metal oxide layer and a transparent conductive oxide layer (S50'), the electrode forming material is laminated (S40), and a light sintering process is performed again to sinter the electrode forming material (S50).

At this time, light sintering of the electrode forming material can be performed under the same conditions as in the first embodiment described above.

for example, the light sintering of the electrode forming material can be performed using a xenon flash lamp having an energy (E) of 5 $J/cm^2$ to 500 $J/cm^2$, a pulse width (W) of 0.1 ms to 50 ms, a pulse number (N) of 1 to 100 times, and a pulse gap of 1 ms to 100 ms.

The light sintering of the metal compound and the transparent conductive oxide can be performed using a xenon flash lamp used for light sintering the electrode forming material.

In this instance, light sintering of the metal compound and the transparent conductive oxide can be performed using a xenon flash lamp with energy and pulse number lower than the energy and the pulse number of the xenon flash lamp used for light sintering the electrode forming material.

Hereinafter, referring to FIGS. 5 to 8, a heterojunction solar cell according to various embodiments of the present invention will be described.

In the following description, the first and second metal oxide layers refer to layers formed by light sintering a metal oxide as described in the first and second embodiments, and the first and second transparent conductive oxide layers refer to layers formed by light sintering the transparent conductive oxide as described in the first and second embodiments described above. The first and second electrode parts refer to layers formed by light sintering electrode formation material as described in the first and second embodiment.

Therefore, in explaining the solar cell according to the embodiment of FIGS. 5 to 8, a detailed description of the method of manufacturing the layers (the first and second metal oxide layers, the first and second transparent conductive oxide layers, the first and second electrodes) will be omitted.

Figure 5:
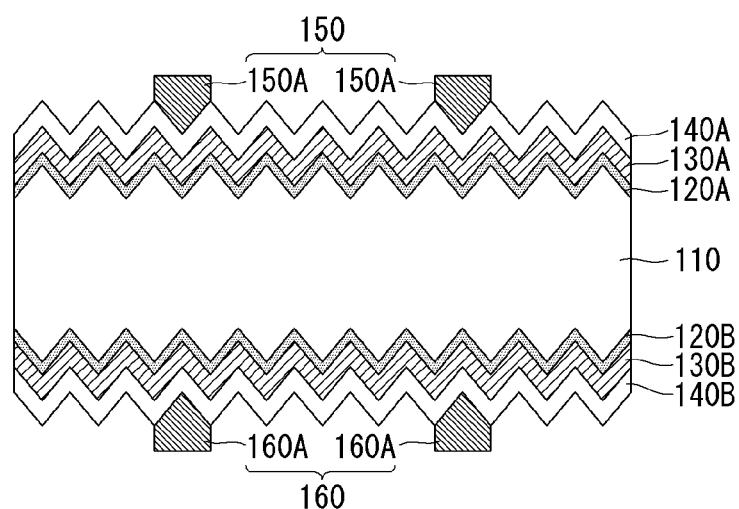
FIG. 5 is a cross-sectional view of a heterojunction solar cell according to the first embodiment of the present invention.

FIG. 5 is a cross-sectional view of a bifacial solar cell. The bifacial solar cell includes the semiconductor substrate (110), a first tunnel layer 120A and a second tunnel layer 120B respectively positioned on the first surface and the second surface of the semiconductor substrate 110, a second metal oxide layer 130A positioned on the first tunnel layer 120A, a first transparent conductive oxide layer 140A positioned on the second metal oxide layer 130A, a first electrode part 150 positioned on the first transparent conductive oxide layer 140A and electrically connected to the second metal oxide layer 130A through the first transparent conductive oxide layer 140A, a first metal oxide layer 130B positioned on the second tunnel layer 120B (specifically, the back surface of the second tunnel layer), a second transparent conductive oxide layer 140B positioned on the first metal oxide layer 130B (specifically, the back surface of the first metal oxide layer), and a second electrode part 160 positioned on the second transparent conductive oxide layer 140B (specifically, the back surface of the second transparent conductive oxide layer) and electrically connected to the first metal oxide layer 130B through the second transparent conductive oxide layer 140B. The second metal oxide layer 130A is formed of a metal oxide having a conductivity type opposite to that of the semiconductor substrate 110 and functions as an emitter region. The first metal oxide layer 130B is formed of a metal oxide having the same conductivity type as that of the semiconductor substrate and acts as a back surface field region. The first transparent conductive oxide layer 140A and the second transparent conductive oxide layer 140B act as an antireflection film and/or a transparent electrode layer, respectively.

At this time, the first tunnel layer 120A and the second tunnel layer 120B may not be provided.

The semiconductor substrate 110 includes a first surface (hereinafter referred to as a front surface) and a second surface (hereinafter referred to as a back surface), and a front surface and a back surface are positioned on opposite sides of the substrate.

Since the semiconductor substrate 110 may be the semiconductor substrate described with reference to FIG. 1, a detailed description thereof will be omitted.

The first tunnel layer 120A positioned on the front surface of the semiconductor substrate 110 and the second tunnel layer 120B positioned on the back surface of the semiconductor substrate are formed by depositing a dielectric material or a semiconductor material, since it corresponds to the tunnel layer described with reference to FIG. 1, detailed description thereof will be omitted.

The second metal oxide layer 130A positioned on the first tunnel layer 120A has a second conductivity type opposite to the first conductivity type, and the first metal oxide layer 130B positioned on the second tunnel layer 120B (specifically, the back surface of the second tunnel layer) has a first conductivity type.

Figure 3:
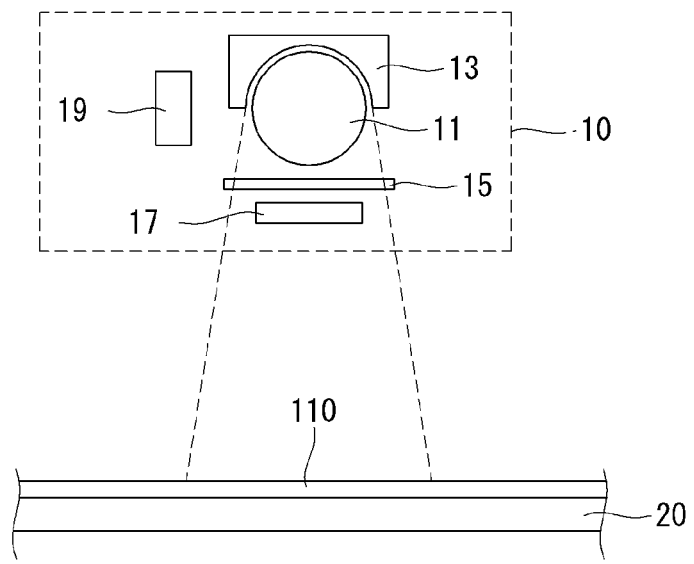
FIG. 3 is a view showing a structure of a light sintering apparatus used in the manufacturing method of FIGS. 1 and 2.

Each of the first metal oxide layer 130B and the second metal oxide layer 130A is formed by forming a metal oxide (including a transition metal and oxygen), and thereafter performing a light sintering process using the light sintering apparatus shown in FIG. 3. Accordingly, the first metal oxide layer 130B and the second metal oxide layer 130A have the first conductivity type or the second conductivity type depending on the inherent Fermi level of the contained transition element.

Accordingly, the first metal oxide layer 130B formed of a metal oxide can function as a back surface field region, and the second metal oxide layer 130A can function as an emitter region.

At this time, the first metal oxide layer 130B and the second metal oxide layer 130A are formed by sintering (or annealing) simultaneously with the electrode forming material in the light sintering process of the electrode parts 150 and 160, or may be sintered by a light sintering (or annealing) process provided separately from the light sintering process of the electrode parts 150 and 160 as in the second embodiment.

The first transparent conductive oxide layer 140A positioned on the second metal oxide layer 130A and the second transparent conductive oxide layer 140B positioned on the first metal oxide layer 130B (specifically, the back surface of the first metal oxide layer) may be formed of any one material selected from ITO, IWO, IZO, and AZO, and functions as a transparent electrode layer and/or an antireflection film.

When the first metal oxide layer 130B or the second metal oxide layer 130A is formed of tungsten oxide or nickel oxide, tungsten or nickel adheres to the copper of the electrode part, thereby preventing diffusion of copper particles.

Therefore, when the metal oxide layers 130A and/or 130B are formed of tungsten oxide or nickel oxide, the copper particles of the electrode parts 150 and/or 160 are prevented from diffusing toward the semiconductor substrate 110.

Accordingly, in this instance, the transparent conductive oxide layer (140A and/or 140B) positioned on top of the metal oxide layer 130A and/or 130B formed of tungsten oxide or nickel oxide is formed of ITO, IWO, IZO, AZO, and the like.

However, when the first metal oxide layer 130B and/or the second metal oxide layer 130A are made of a material (for example, metal oxide which does not prevent diffusion of copper particles) other than the metal oxide (i.e., tungsten oxide and nickel oxide), it is preferable that the transparent conductive oxide layer is formed of the transparent conductive oxide layer containing tungsten, for example, IWO to prevent the copper particles contained in the electrode parts 150 and 160 from diffusing.

Accordingly, the first transparent conductive oxide layer 140A and the second transparent conductive oxide layer 140B may be formed of the same material or may be formed of different materials, depending on the material of the underlying metal oxide layer.

When the first transparent conductive oxide layer 140A and the second transparent conductive oxide layer 140B are formed of different materials, the transparent conductive oxide layer positioned between the metal oxide layer formed of a metal oxide material that does not prevent the diffusion of copper particles and the electrode parts 150 or 160 may be formed of IWO, and the transparent conductive oxide layer positioned between the metal oxide layer formed of a metal oxide material (for example, tungsten oxide and nickel oxide) capable of preventing diffusion of copper particles and the electrode parts 160 or 150 may be formed of any one material selected from ITO, IZO, and AZO.

The first transparent conductive oxide layer 140A and the second transparent conductive oxide layer 140B may be formed by an evaporation process and then an annealing process using the light sintering apparatus shown in FIG. 3.

At this time, the first transparent conductive oxide layer 140A and the second transparent conductive oxide layer 140B are formed simultaneously with the electrode forming material in the light sintering process of the electrode parts 150 and 160 as in the first embodiment described above or may be sintered by a light sintering process separately provided from the light sintering process of the electrode parts 150 and 160 as in the second embodiment described above.

When the semiconductor substrate 110 has a textured surface, each of the tunnel layers 120A and 120B, the metal oxide layers 130A and 130B, and the transparent conductive oxide layers 140A and 140B has a textured surface including a plurality of concavities and convexities similar to the semiconductor substrate 110.

The first electrode parts 150 positioned on the first transparent conductive oxide layer 140A may include a plurality of first finger electrodes 150A spaced apart from each other and extending in a predetermined constant direction.

At this time, the plurality of first finger electrodes 150A may be electrically connected to the second metal oxide layer 130A through the first transparent conductive oxide layer 140A.

Since the plurality of first finger electrodes 150A are formed of the above-described electrode forming material, a detailed description thereof will be omitted.

The electrode forming material forming the plurality of first finger electrodes can be sintered by a light sintering process using the light sintering apparatus shown in FIG. 3.

The second electrode part 160 positioned on the back surface of the second transparent conductive oxide layer 140B may include a plurality of second finger electrodes 160A. Each of the plurality of second finger electrodes 160A is spaced apart from each other and extends in the same direction as the first finger electrodes 150A.

The plurality of second finger electrodes 160A may be positioned at a position facing the plurality of first finger electrodes 150A with the semiconductor substrate 110 interposed therebetween. Accordingly, the number of the first finger electrodes 150A and the number of the second finger electrodes 160A may be the same. However, the embodiments of the present invention are not limited thereto.

The plurality of second finger electrodes 160A may be electrically connected to the first metal oxide layer 130B through the second transparent conductive oxide layer 140B.

The plurality of second finger electrodes 160A may be formed by applying a conductive paste having the same composition as the plurality of first finger electrodes 150A and then sintering the same by the same method (light sintering) as the first finger electrodes 150A.

Alternatively, the plurality of first finger electrodes 150A and the plurality of second finger electrodes 160A may be formed by applying a conductive paste having a different composition to each other and then sintering the conductive paste by a light sintering process.

On the other hand, in the instance of a bifacial solar cell, the amount of light incident through the front surface of the semiconductor substrate 110 is larger than the amount of light incident through the back surface. Accordingly, the number of the second finger electrodes 160A positioned on the back surface of the semiconductor substrate may be greater than the number of the first finger electrodes 150A positioned on the front surface of the semiconductor substrate.

In this instance, the interval (i.e., the pitch) between the second finger electrodes 160A may be smaller than the interval between the first finger electrodes 150A, and the position of the first finger electrode 150A and the position of the second finger electrode 160A may not correspond to each other.

The first electrode unit 150 may further include at least two first bus bar electrodes extending in a direction crossing (or orthogonal to) the plurality of first finger electrodes 150A to electrically and physically connect the plurality of first finger electrodes 150A. Also, the second electrode unit 160 may further include at least two second bus bar electrodes extending in a direction crossing (or orthogonal to) the plurality of second finger electrodes 160A to electrically and physically connect the plurality of second finger electrodes 160A.

In this instance, in order to electrically connect the neighboring solar cells, the first bus bar electrode and the second bus bar electrode may be formed at positions corresponding to each other with the semiconductor substrate 110 interposed therebetween.

Therefore, when light is incident on the semiconductor substrate 110 through the second metal oxide layer 130A and the first metal oxide layer 130B, electron-hole pairs are generated in the semiconductor substrate 110.

In this instance, when the front surface and/or the back surface of the semiconductor substrate 110 have the textured surface, light reflectance in the front surface and/or the back surface of the semiconductor substrate 110 is reduced. Further, because both a light incident operation and a light reflection operation are performed on the textured surfaces of the semiconductor substrate 110, light is confined in the solar cell. Hence, a light absorptance and the efficiency of the solar cell are improved.

In addition, reflection loss of light incident on the semiconductor substrate 110 is reduced by the first transparent conductive oxide layer 140A and the second transparent conductive oxide layer 140B. Therefore, the amount of light incident on the semiconductor substrate 110 further increases.

The electron-hole pairs generated inside the semiconductor substrate 110 are separated from each other. Therefore, when the semiconductor substrate 110 has the n-type conductivity, the electrons move toward the back surface (specifically, the first metal oxide layer) of the semiconductor substrate 110 having the n-type conductivity, and the holes move toward the second metal oxide layer 130A having the p-type conductivity.

Also, the electrons that have moved toward the first metal oxide layer 130B move to the second electrode part 160 through the first metal oxide layer 130B, and the holes that have moved toward the second metal oxide layer 130A move to the first electrode part 150.

Therefore, in neighboring solar cells, current flows when the first electrode part 150 of one solar cell and the second electrode part 160 of another solar cell adjacent to the one solar cell are connected by a conductive ribbon (or interconnector).

Figure 6:
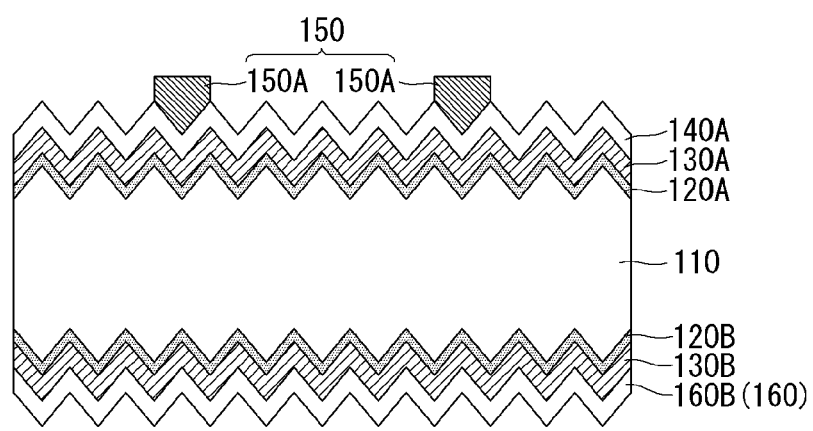
FIG. 6 is a cross-sectional view of a heterojunction solar cell according to a second embodiment of the present invention.

Hereinafter, a heterojunction solar cell according to a second embodiment of the present invention will be described with reference to FIG. 6.

In the present embodiment, the first tunnel layer 120A, the second metal oxide layer 130A, the first transparent conductive oxide layer 140A, and the first electrode layer 150, which are respectively disposed on the front surface of the semiconductor substrate 110, is the same as the above-described heterojunction solar cell of the first embodiment of FIG. 5. The second tunnel layer 120B and the first metal oxide layer 130B disposed on the back surface of the semiconductor substrate 110 are also the same as those of the first embodiment of the heterojunction solar cell of FIG. 5.

However, in the heterojunction solar cell of the present embodiment, the second electrode part 160 is positioned on the back surface of the first metal oxide layer 130B positioned on the back surface of the semiconductor substrate 110, and the electrode part 160 includes a second electrode 160B having a sheet shape.

That is, in the heterojunction solar cell of the present embodiment, the second electrode part 160 does not have a finger electrode, and the second electrode 160B having the sheet shape substantially covers the entire back surface of the first metal oxide layer 130B.

The second electrode part 160 may include the second bus bar electrode at a position corresponding to the first bus bar electrode of the first electrode part 150. In this instance, the second electrode 160B may cover the first metal oxide layer 130B in regions other than the region where the second bus bar electrode is formed.

The solar cell having such a structure does not receive light through the back surface of the semiconductor substrate 110 due to the second electrode 160B positioned on the back surface of the semiconductor substrate 110. Therefore, it can be used as a unifacial heterojunction solar cell.

Figure 7:
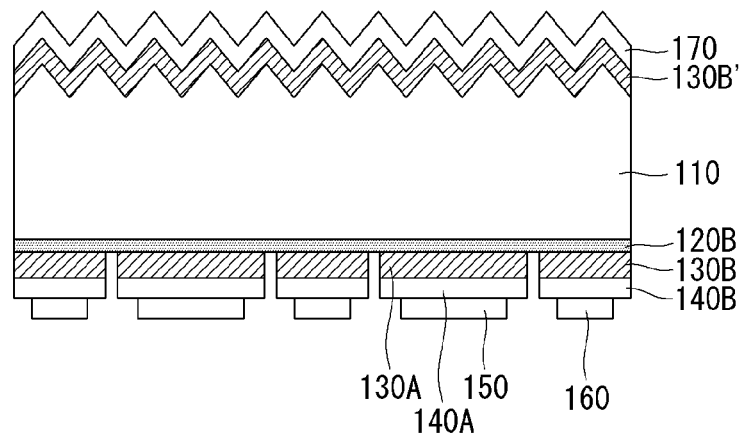
FIG. 7 is a cross-sectional view of a heterojunction solar cell according to a third embodiment of the present invention.

Referring to FIG. 7, a heterojunction solar cell according to a third embodiment of the present invention will be described.

The present embodiment relates to a back contact type heterojunction solar cell in which a front surface field region 130B' is positioned on the front surface of the semiconductor substrate 110.

The front electric field region 130B' may be formed of the same metal oxide as the first metal oxide layer 130B serving as a back surface field region. Accordingly, the first metal oxide layer 130B and the front surface field region 130B' may be formed of the same material.

However, the front surface field region 130B' may be formed of another kind of metal oxide having the same conductivity type as that of the first metal oxide layer 130B, or may be formed of an amorphous silicon layer containing a dopant.

An antireflection film 170 is disposed on the front surface field region 130B' and may be formed of at least one selected from aluminum oxide (AlOx), silicon nitride (SiNx), silicon oxide (SiOx), and silicon oxynitride (SiOxNy).

The antireflection film 170 reduces the reflectivity of light incident on the solar cell and increases the selectivity of a specific wavelength region, thereby increasing the efficiency of the solar cell.

The antireflection film 170 may be formed as a single film structure, but may have a multilayer film structure such as a double film and may be omitted as necessary.

The second tunnel layer 120B is positioned on the back surface of the semiconductor substrate 110. On the back surface of the second tunnel layer 120B, the first metal oxide layer 130B and the second metal oxide layer 130A are alternately spaced apart from each other.

The first transparent conductive oxide layer 140A and the first electrode part 150 are sequentially stacked on the back surface of the second metal oxide layer 130A. The second transparent conductive oxide layer 140B and the second electrode part 160 are sequentially stacked on the back surface of the first metal oxide layer 130B.

The first transparent conductive oxide layer 140A is alternately spaced apart from the second transparent conductive oxide layer 140B and the first electrode part 150 is alternately spaced apart from the second electrode part 160.

The widths of the transparent conductive oxide layers 140A and 140B may be less than or equal to the widths of the metal oxide layers 130A and 130B and the widths of the electrode parts 150 and 160 may be less than the widths of the transparent conductive oxide layers 140A and 140B.

The width of the first metal oxide layer 130B and the width of the second metal oxide layer 130A may be the same or different from each other.

Figure 8:
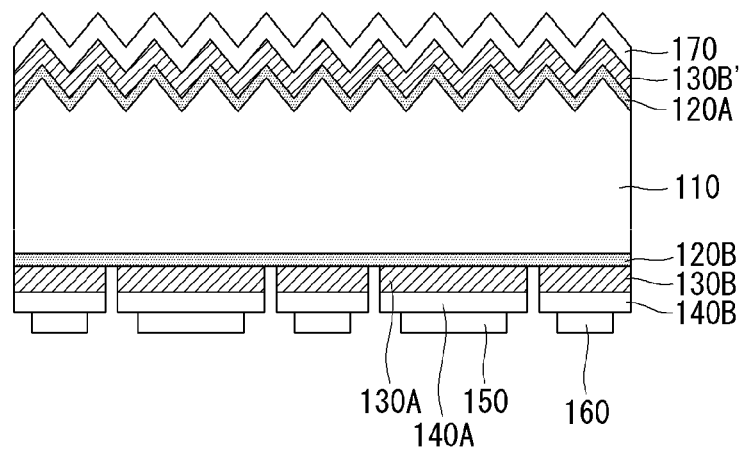
FIG. 8 is a cross-sectional view of a heterojunction solar cell according to a fourth embodiment of the present invention.

Hereinafter, a heterojunction solar cell according to a fourth embodiment of the present invention will be described with reference to FIG. 8.

The heterojunction solar cell of this embodiment has the same structure as the above-described heterojunction solar cell of the third embodiment of FIG. 7 except that the first tunnel layer 120A is further disposed between the front surface field 130B' and the semiconductor substrate 110. Therefore, a detailed description thereof is omitted.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a heterojunction solar cell, the method comprising:
    Forming a tunnel layer on a semiconductor substrate;
    forming a metal compound on the tunnel layer;
    forming a transparent conductive oxide on the metal compound;
    forming an electrode forming material on the transparent conductive oxide;
    sintering the electrode forming material using light sintering to form an electrode part,
    wherein the transparent conductive oxide is also sintered by the light sintering to form a transparent conductive oxide layer formed of the transparent conductive oxide,
    wherein the transparent conductive oxide layer and the electrode part are simultaneously formed by light sintering the transparent conductive oxide when light sintering the electrode forming material, and
    wherein a metal compound layer formed of the metal compound, the transparent conductive oxide layer, and the electrode part are simultaneously formed by light sintering the metal compound when light sintering the transparent conductive oxide and the electrode forming material.

2. The method of claim 1, wherein the light sintering is carried out by using a xenon flash lamp having an energy (E) of 5 J/cm2 to 500 J/cm2, a pulse width (W) of 0.1 ms to 50 ms, a pulse number (N) of 1 to 100 times, and a pulse gap of 1 ms to 100 ms.

3. The method of claim 1, wherein the metal compound is formed of any one of metal oxides selected from oxides including transition metals.

4. The method of claim 3, wherein the metal compound is formed of any one of the binary metal oxides selected from molybdenum oxide, titanium oxide, vanadium oxide, tungsten oxide, zinc oxide, manganese oxide, nickel oxide, and chromium oxide.

5. The method of claim 3, wherein the transparent conductive oxide is formed of any one material selected from ITO, IWO, IZO, and AZO.

6. The method of claim 3, wherein the electrode forming material is formed of a conductive paste containing fine metal particles, a binder and a solvent, and the fine metal particles include at least one selected from copper, copper-silver, and copper-nickel.

7. The method of claim 6, wherein the fine metal particles are formed into micro- or nano-sized particles, and the conductive paste is formed by mixing 50 to 80% by weight, 15 to 40% by weight, and 5 to 40% by weight of the fine metal particles, the binder, and the solvent, respectively, with respect to a total weight of the conductive paste.

8. The method of claim 3,
    wherein the tunnel layer is formed of intrinsic amorphous silicon or silicon oxide.

* * * * *